United States Patent [19]

Amdahl et al.

[11] Patent Number: 4,621,201

[45] Date of Patent: Nov. 4, 1986

[54] INTEGRATED CIRCUIT REDUNDANCY AND METHOD FOR ACHIEVING HIGH-YIELD PRODUCTION

[75] Inventors: Carlton G. Amdahl, Saratoga; Gene M. Amdahl, Atherton; Robert Reinschmidt, San Jose, all of Calif.

[73] Assignee: Trilogy Systems Corporation, Cupertino, Calif.

[21] Appl. No.: 595,097

[22] Filed: Mar. 30, 1984

[51] Int. Cl.$^4$ .......................................... H03K 19/003
[52] U.S. Cl. ........................... 307/219; 307/200 A; 307/243; 307/291; 307/441; 307/455; 307/464; 307/467; 324/73 R
[58] Field of Search .................. 307/200 A, 441, 443, 307/455, 464–467, 470, 219, 243, 272 R, 291, 303; 324/73 R, 73 AT; 371/25, 36

[56] References Cited

U.S. PATENT DOCUMENTS

| | | | |
|---|---|---|---|
| 3,460,094 | 8/1969 | Pryor | 371/36 X |
| 3,569,731 | 3/1971 | Gavira | 307/441 |
| 3,597,626 | 8/1971 | Heightley | 307/464 |
| 4,105,900 | 8/1978 | Martin et al. | 307/219 |
| 4,281,398 | 7/1981 | McKenny et al. | 307/441 X |
| 4,375,683 | 3/1983 | Wensley | 371/36 |
| 4,513,283 | 4/1985 | Leininger | 307/455 X |
| 4,540,903 | 9/1985 | Cooke et al. | 307/465 |

FOREIGN PATENT DOCUMENTS 0011558 2/1978 Japan ...................................... 371/36

Primary Examiner—Stanley D. Miller
Assistant Examiner—D. R. Hudspeth
Attorney, Agent, or Firm—Townsend and Townsend

[57] ABSTRACT

A circuit structure, and method for forming the structure, permits wafer scale integration by fabricating plural copies of the circuit in integrated circuit form, and interconnecting predetermined circuit element groups of the copies in a manner that permits a majority voting operation to take place. In this manner, defective circuit elements are masked by being out-voted by corresponding non-defective circuit elements that participate in the voting process. Alternate embodiments of a voter unit, used to implement the voting operation, includes a preferred embodiment that takes advantage of emitter-coupled-logic structure to provide a multiplex, voter, latch combination capable of selectively implementing normal and diagnostic operation. Included in the preferred embodiment of the voter unit is a fused link that implements a repair operation in the event there exists more defective circuit element groups than non-defective circuit element groups participating in the voting process.

41 Claims, 13 Drawing Figures

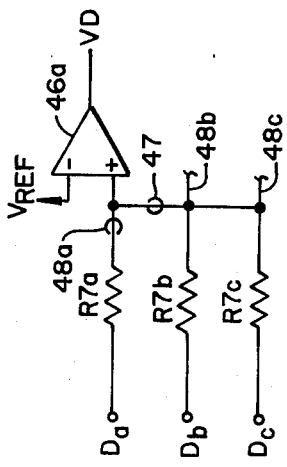
FIG._1.
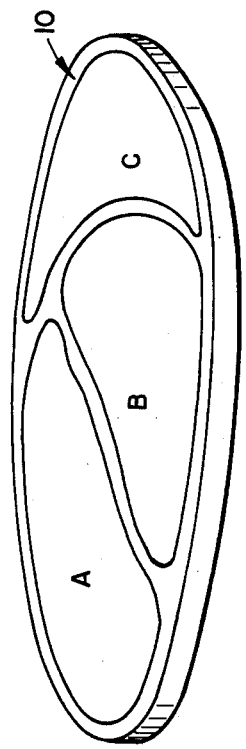
FIG._4.
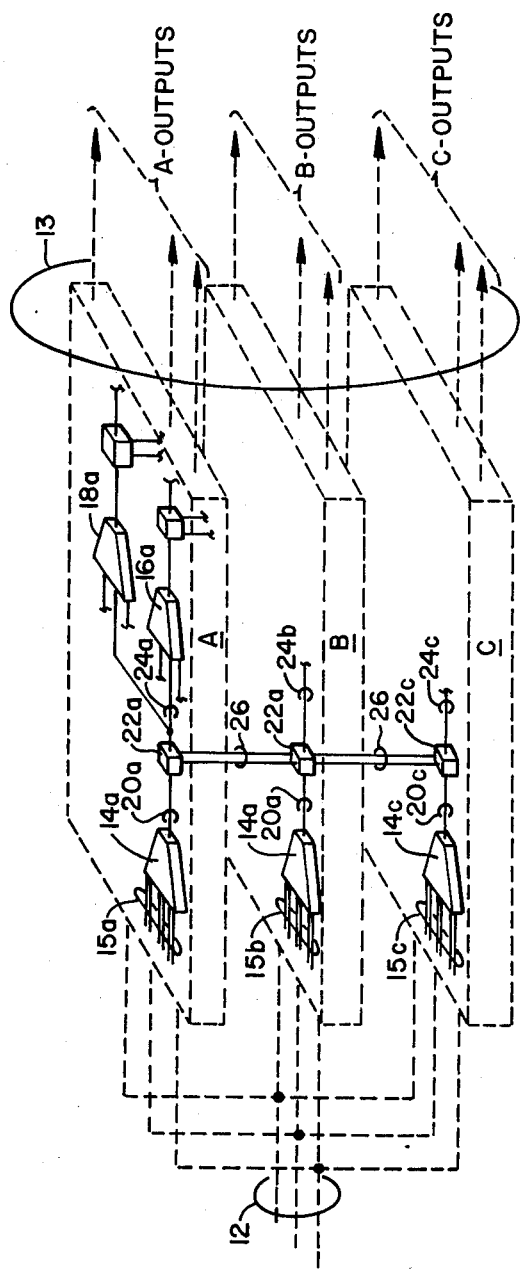
FIG._2.

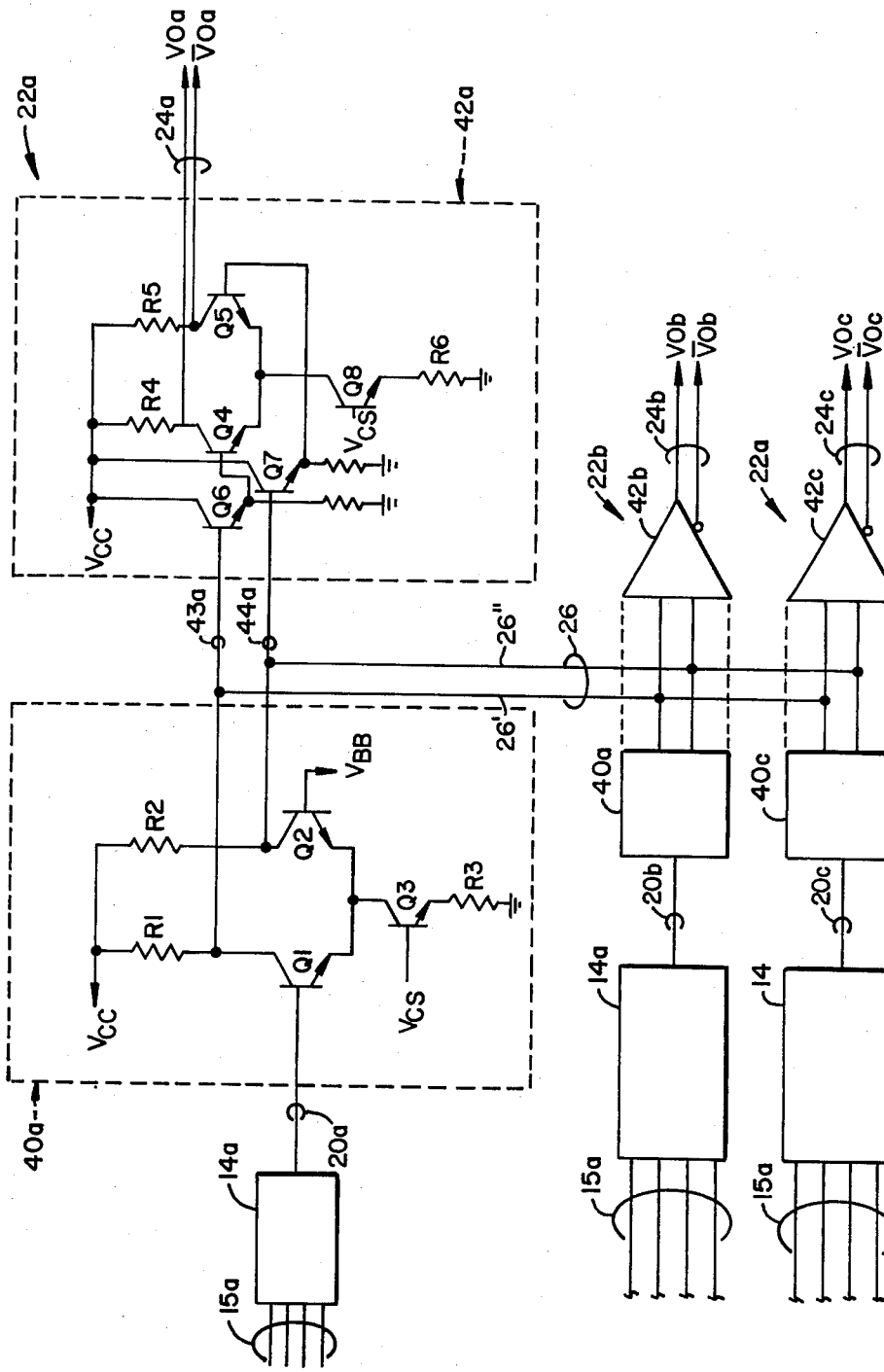
FIG._3.

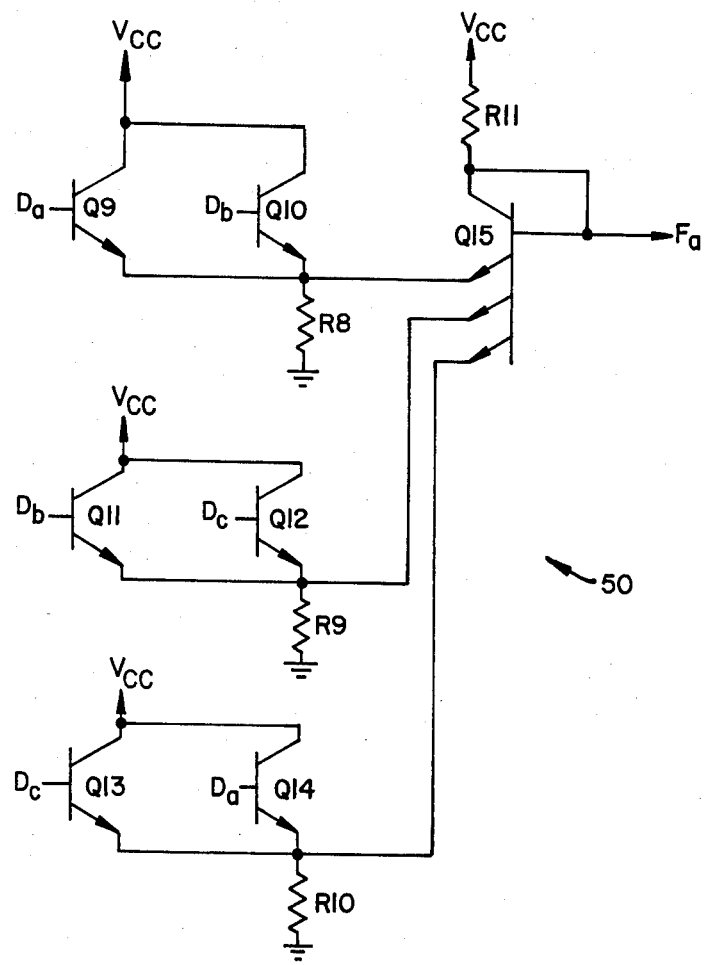
FIG._5.
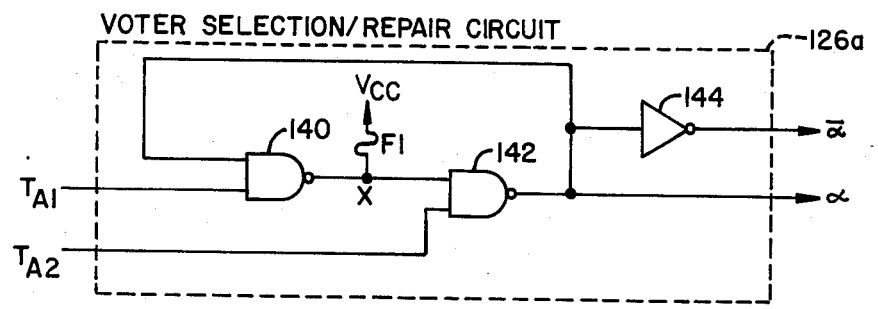
FIG._10.

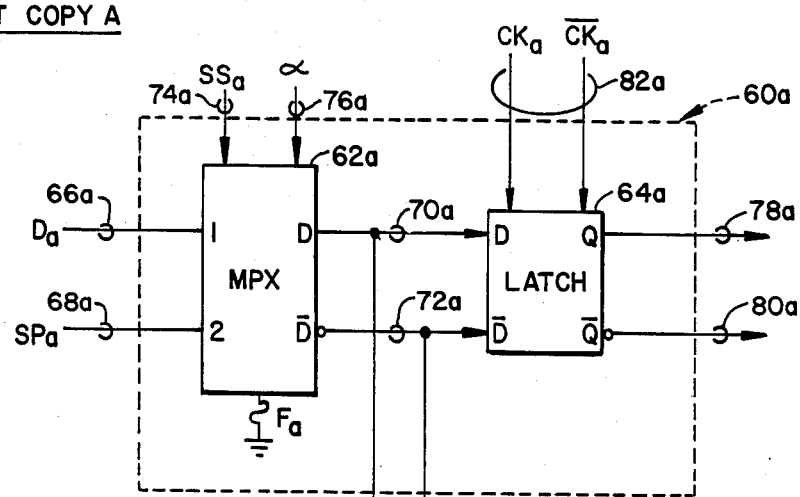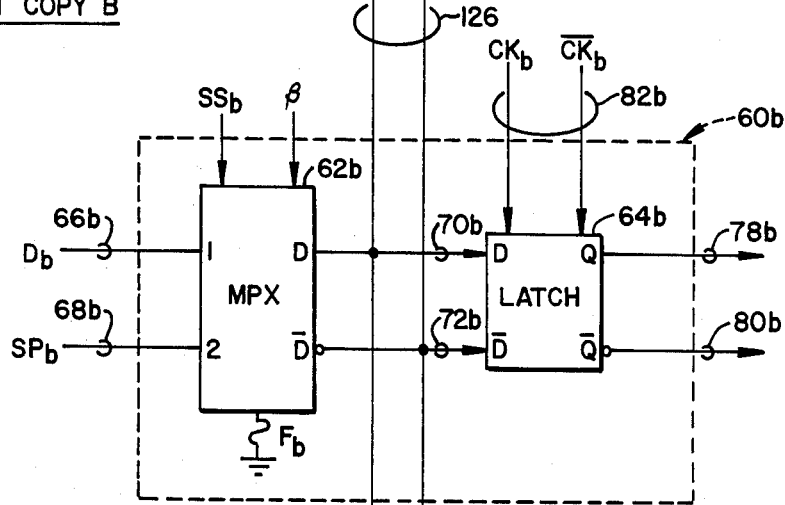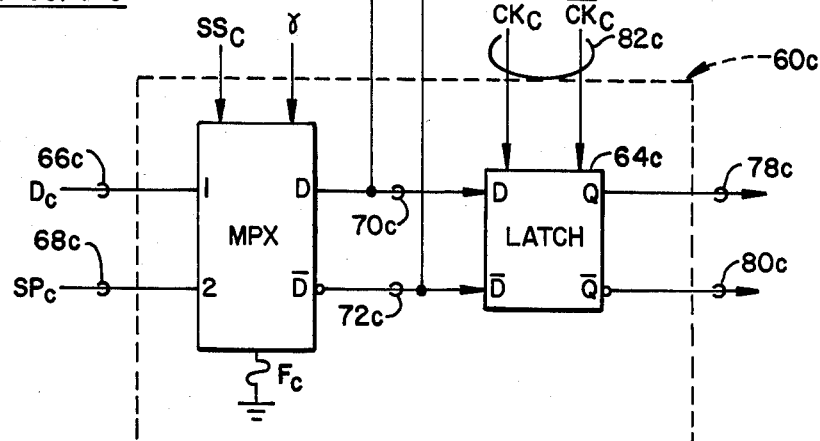
FIG._6.

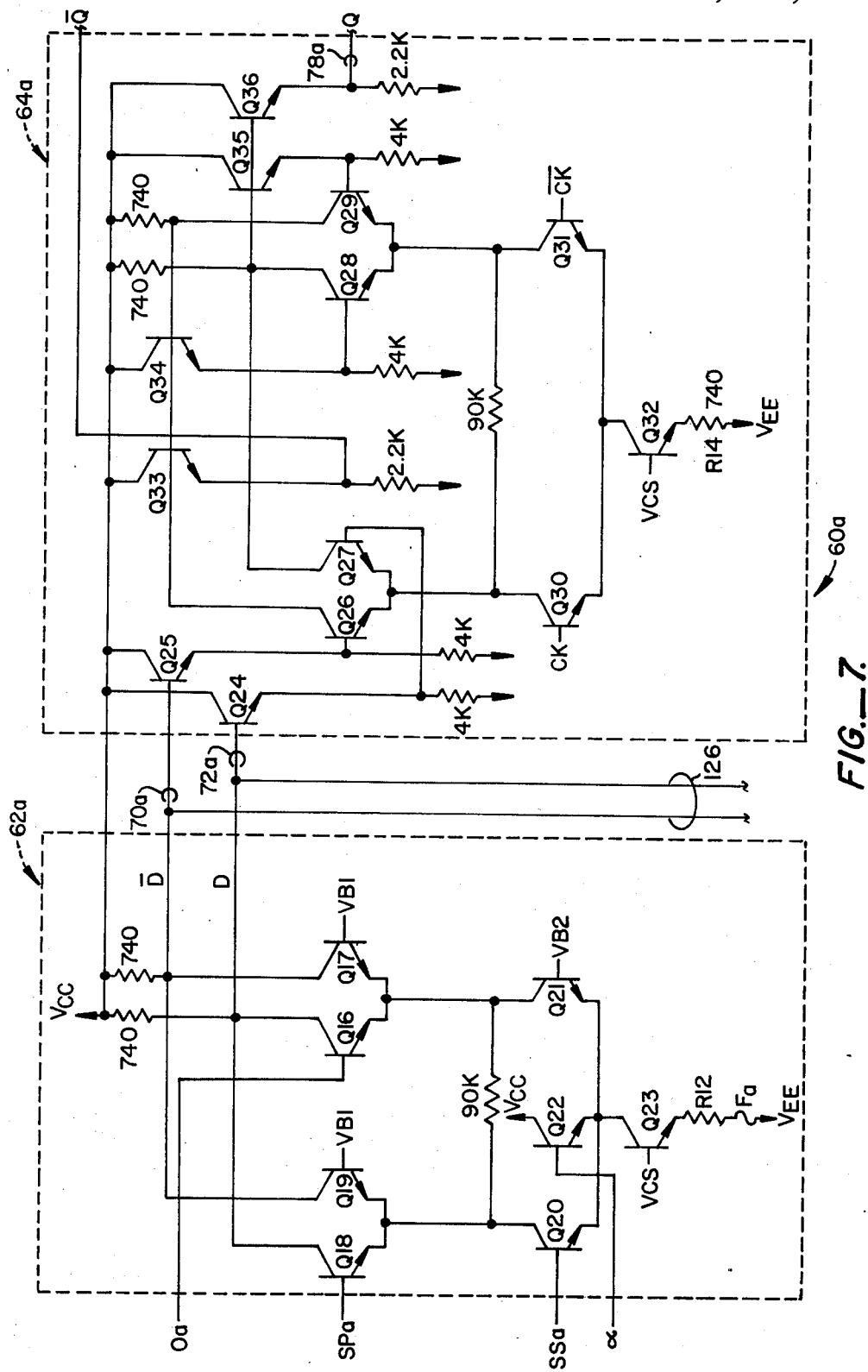
FIG._7.

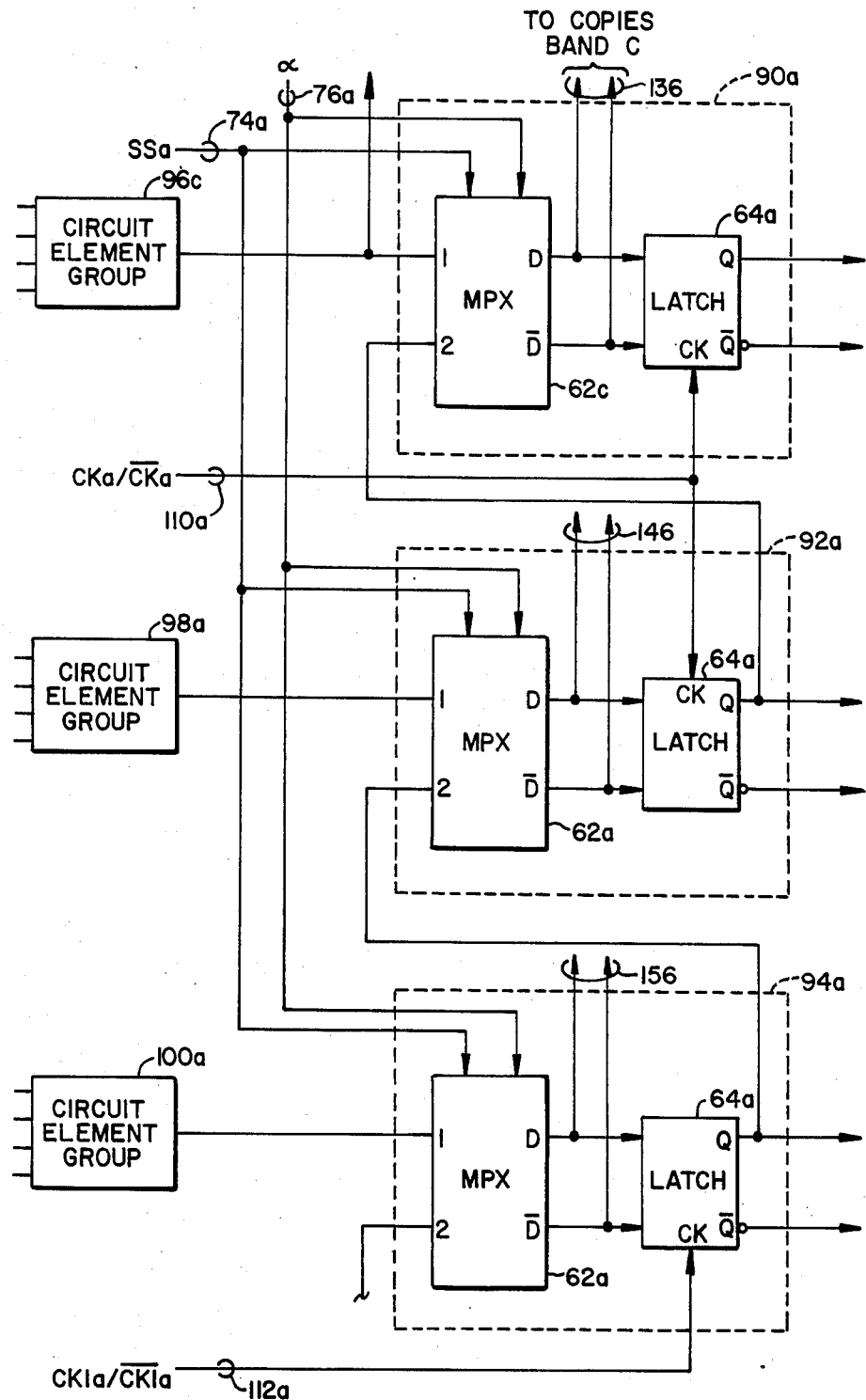
FIG._8.

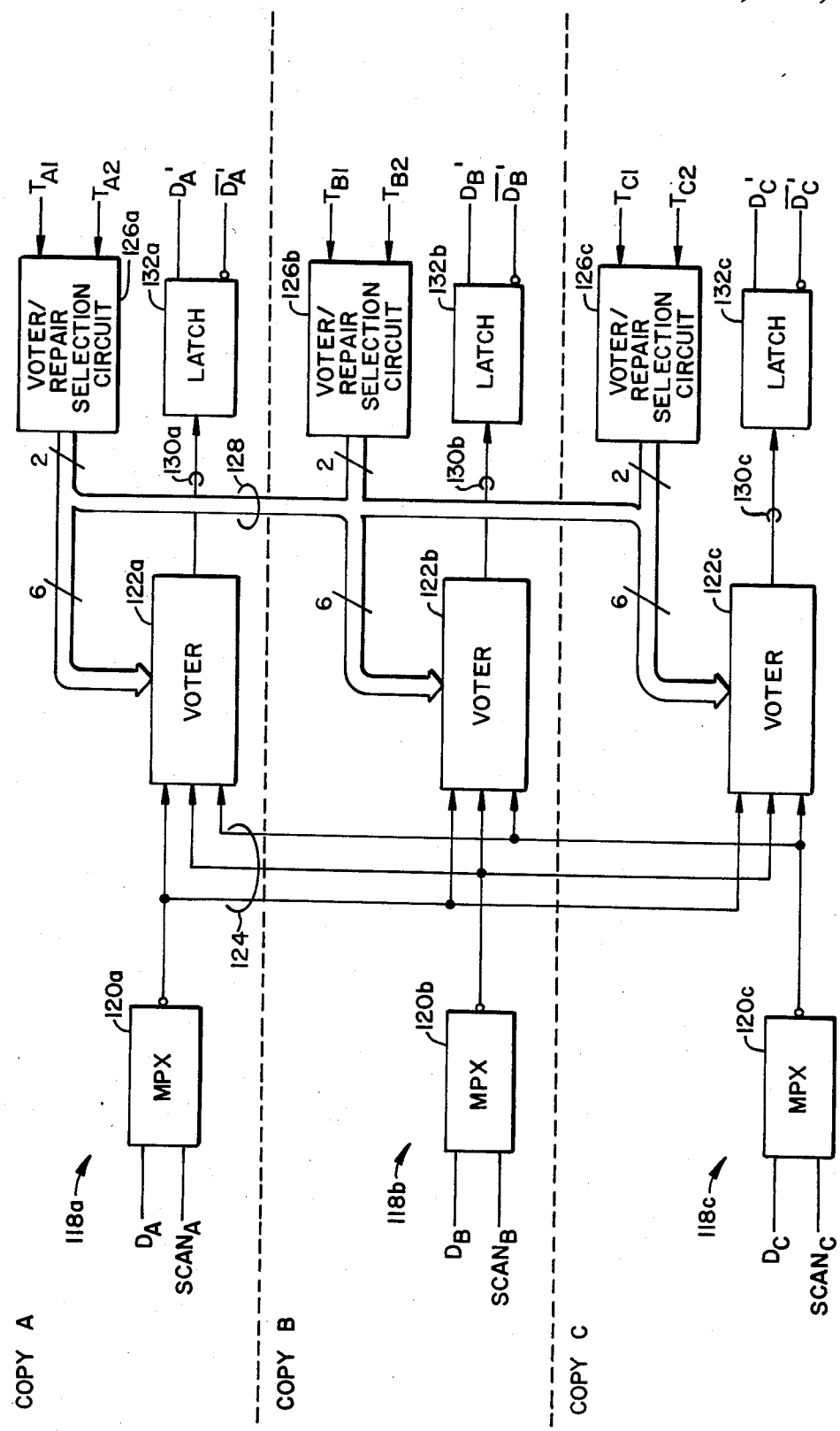
FIG._9.

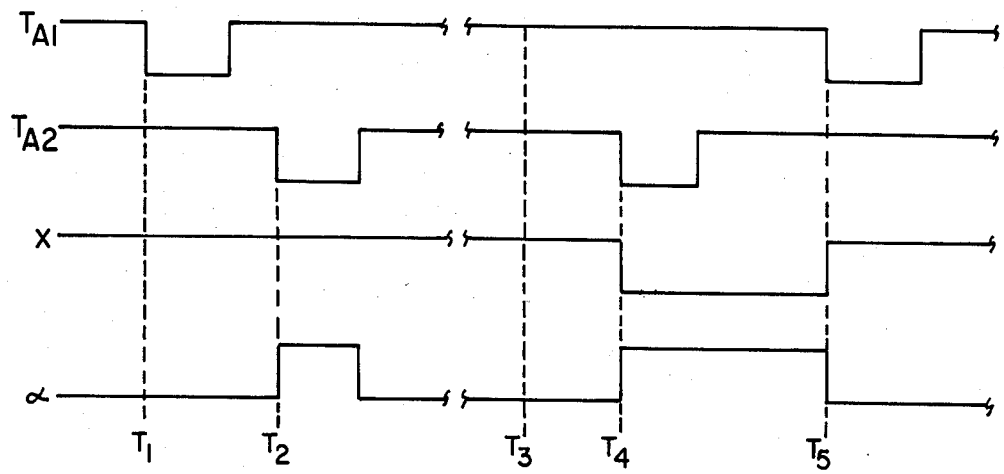
FIG._11.
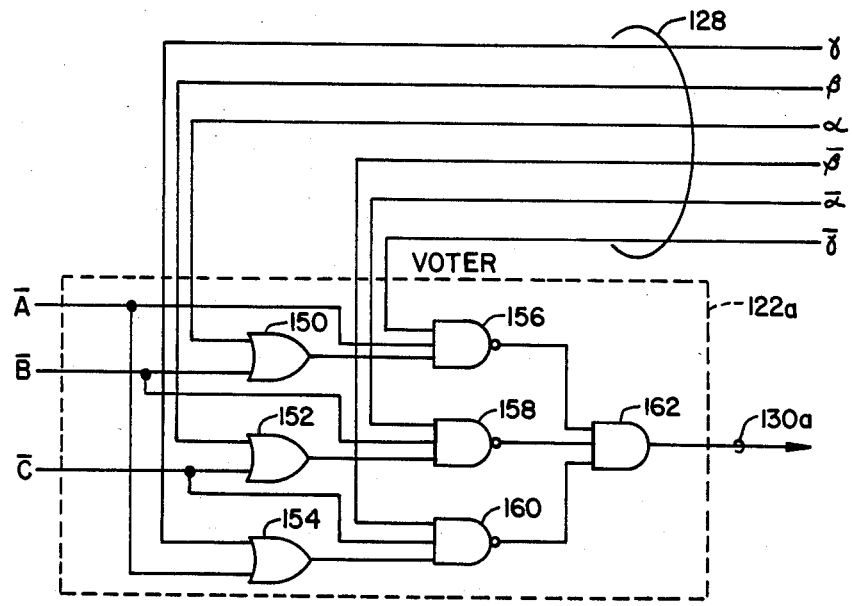
FIG._12.
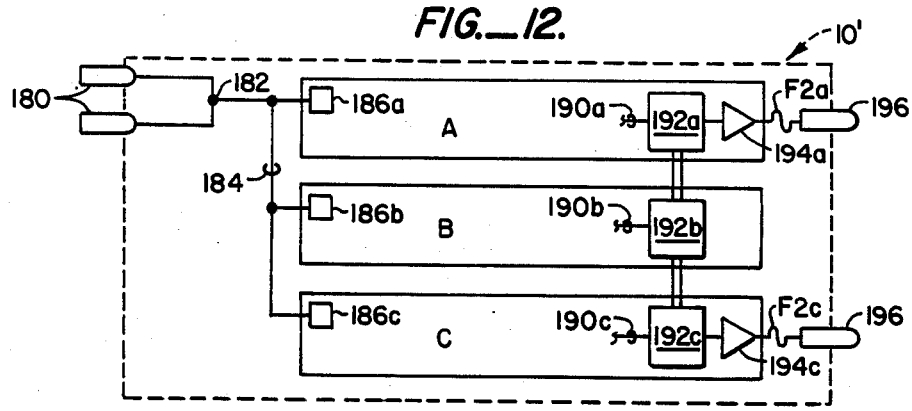
FIG._13.

INTEGRATED CIRCUIT REDUNDANCY AND METHOD FOR ACHIEVING HIGH-YIELD PRODUCTION

BACKGROUND OF THE INVENTION

The present invention is directed generally to integrated circuits and their fabrication, and more specifically to a redundant circuit configuration that functions to improve the production yield of integrated circuits, making feasible the formation of a single "macro-circuit" on an entire silicon wafer (hereinafter "wafer scale integration").

As used herein, the terms "redundant" or "redundancy" are used in their normal sense to refer to extra copies of a circuit. However, it is recognized that these terms enjoy a specialized meaning in the field maintenance and reliability of digital systems: A circuit is said to be redundant (or has redundancy) if there is no test available for detecting a particular fault. As will be seen, this latter meaning could apply in a general sense to the present invention. However, unless indicated otherwise, interpretation herein of the terms redundant and/or redundancy should be made as if they were used in their normal sense.

Recent advances in the field of semiconductor fabrication have resulted in an integrated circuit technology capable of providing large amounts of electronic circuitry in a very small package. The advantages of constructing electronic systems from integrated circuitry often include a savings in cost, size, weight, and power consumption when compared to a similar system constructed from discrete components. A further advantage includes realization of a high circuit speed within the integrated circuit itself since signals will not be slowed down as they would when moving from package to package. In addition, a fully-tested, operable integrated circuit provides increased reliability over a similar configuration of discrete devices, resulting in reduced maintenance costs to the ultimate user.

These advances have, in part, concentrated on increasing integrated circuit fabrication "yield" (the number of operable circuits per fabrication run), either by reducing the density of defects in a "wafer" (the silicon substrate upon which an integrated circuit is formed) or by reducing the dimensions of the circuit "die" (that area of the wafer used to form each individual circuit). At present, defects in a wafer cannot be avoided during integrated circuit fabrication, and a single defect can ruin an entire circuit. As one might expect, the larger the die that forms the circuit the greater chance for a defect to appear and render the circuit inoperative. Yield, therefore, decreases as the size of the die increases, both because there are fewer places on a wafer for larger die and because larger circuits are more likely to incorporate a defect and be rendered useless. Thus, if too much electronic function is packed into a circuit, the large size of the die required to form the circuit would result in such a low yield per wafer that the cost per circuit may become prohibitive.

A typical electronic system contains both large-scale and medium-scale integrated circuits, and the cost of designing and constructing the system rises rapidly as the number of individual circuits increases. When a large number of discrete, less powerful, cheaper circuits are used to construct the system, testing and assembly costs tend to build up. To minimize the total cost of the system one would like ideally to use either a small number of very powerful and complex integrated circuits. Not only are labor costs reduced, but this would provide the system with the high speed, small size, reduced weight and low power-consuming advantages of integrated circuit technology. Again, however, if too much electronic function is packed into a circuit, as mentioned above, the large size of the die may result in such a low yield per wafer that the cost per circuit would become prohibitive.

Thus, it can be seen that while it is extremely desirable to put as much circuit function as possible into a single microelectronic circuit, the larger die size resulting from the increased function may so reduce the yield as to limit very large-scale, much less wafer-scale, integration.

SUMMARY OF THE INVENTION

The present invention is directed to fabricating an integrated circuit using a redundant circuit configuration that increases production yield to the point of permitting wafer scale integration.

According to the present invention, redundant copies of an electronic circuit are formed on a single integrated circuit chip or die. The circuit copies are functionally and electrically identical to one another; they receive the same input signals, and they are capable of providing the same output signals. The circuit elements that make up each circuit copy are designated as being a member of one or more predetermined circuit element groups. Each circuit element group is defined by a single functional output of that group, and for each circuit element group found in one circuit copy there is a corresponding and an electrically and functionally identical circuit element group to be found in each of the other circuit copies formed on the same die. The output of each circuit element group is operably coupled to that of the corresponding circuit element groups in a manner that permits a "voting" to take place, producing therefrom a voted output signal that is representative of a majority of the received signals produced by the intercoupled circuit element groups. The voted output signal is then used in the respective circuit copies as the unvoted signals would have been used, i.e., they are coupled and applied to one or more inputs of other circuit elements (and, therefore, other circuit element groups) of the respective circuit copy.

While there are a number of techniques for performing the voting function used in the practice of the present invention, as will be discussed in the detailed description of the invention, the preferred embodiment provides a test and repair capability. This capability allows each circuit element group to be independently tested and, if found defective, to be disabled from the voting operation in a manner that leaves the corresponding circuit element groups unaffected.

In the preferred embodiment of the invention, each circuit element group output is coupled to the corresponding outputs of the circuit copies by a wired logic circuit voter connection that implements a two-out-of-three voting configuration. Such a configuration is preferably accomplished in accordance with the teachings of commonly assigned, copending application Ser. No. 595,086, filed Mar. 30, 1984 in the name of Robert M. Reinschmitt, the disclosure of which is hereby incorporated by reference as if fully set forth herein.

In addition, each voter connection includes a two-input multiplexer and a latch, the latch forming the output stage of each multiplexer/voter/latch combination. Each multiplexer is configured to receive at one input the output signal produced by the associated circuit element group; the second multiplexer input receives a voted and latched output signal from another of the circuit element groups. Interconnecting circuit element groups in this manner, via the second multiplexer input, forms an extended shift register that is used for diagnostic purposes to determine operative and inoperative circuit element groups.

The multiplexers are constructed to respond to test signals that place them in one of two test states: A first test state selects the second input to interconnect the multiplexer/voter/latch combinations in several shift register configurations; a second test state disables the multiplexer, and therefore the circuit element group associated therewith, from participation in a voting procedure. These test states are used to selectively disable one or more of the circuit copies and to implant predetermined diagnostic state conditions in order to isolate defective circuit element groups via diagnostic testing.

Further, each multiplexer of each multiplexer/voter/latch combination includes a fusable link that, when interrupted, functions to disable the circuit element group associated therewith from participation in the voting operation. Defects occurring in two of a voted set (of, preferably, three) corresponding circuit element groups will cause an incorrect vote. Which two of the three are defective can be determined by selectively suppressing corresponding pairs of the circuit element groups during diagnostic testing until the good circuit element group is identified. The two circuit element groups found defective are permanently removed from operation by interrupting the fusable links associated therewith.

It will be appreciated by those skilled in the art that the present invention provides a number of advantages. A significant advantage is the prospect of increased yield of electronic integrated circuitry incorporating the present invention. This advantage flows, in part, from the reduction of the effective die area subject to fabrication defects and capable of rendering the entire die defective. A single defect affecting only one of the corresponding three element groups, which would heretofore render a circuit useless, is in effect masked by the present invention. Defects must occur in all three of a voted set of corresponding circuit element groups before a die and the circuit formed thereon must be scrapped. Even if two of a corresponding set of voted circuit element groups are found to be defective, as long as one circuit element group of the set is identified as being acceptabe the circuit can be "repaired" by deleting the unacceptable circuit element groups from operation.

Increased yield means that very large and even wafer scale integration becomes economically feasible to a greater extent than before. Much larger electronic systems can be constructed in integrated circuit form on a single substrate (be it the entire wafer or an enlarged die) to take advantage of the increased speed, reduced power consumption and small size advantages offered by integrated circuit technology.

A further advantage concerns those circuit faults that escape initial diagnostic testing, allowing defective integrated circuits to be placed on the market. Theoretically, there may be an extremely large number of state conditions that an electronic circuit can assume, each depending, in part, on the previous states assumed by the circuit. Testing may cause an electronic circuit to assume only a fraction of the maximum number of states, allowing an erroneous state condition caused by a defect to escape detection. Tested and presumably good integrated circuits carrying such defects are marketed to create subsequent, and what can be chaotic or even disastrous, problems in an actual operating environment. The circuitry redundancy of the present invention will render such problems practically nonexistent.

These and other and further advantages of the present invention will become apparent to those skilled in the art upon a reading of the following detailed description of the invention, which should be taken in conjunction with the accompanying drawings.

BRIEF DESCRIPTION OF THE DRAWINGS

FIG. 1 is a representation of a semiconductor substrate upon which is formed three redundant copies of an electronic circuit;

FIG. 2 is a conceptual illustration of the redundant circuit copies shown in FIG. 1, diagrammatically showing corresponding, representative circuit element groups in each copy and their interconnection;

FIG. 3 is a simplified diagrammatic illustration of the wired voting configuration used to implement the present invention;

FIGS. 4 and 5 are circuit diagrams of alternate embodiments of wired voter configurations;

FIG. 6 is a block diagram of the preferred embodiment of the wired voter configuration used to implement the present invention, showing the use of a two-input multiplexer and a latch combination;

FIG. 7 is a circuit diagram of one of the two-input multiplexer and latch circuits of FIG. 6;

FIG. 8 diagrammatically represents a configuration of multiplexer/voter/latch combinations of one of the circuit copies to illustrate their intercoupled operation during diagnostic testing;

FIG. 9 illustrates an alternate embodiment of the invention, implemented in MOS circuit technology;

FIG. 10 illustrates the logic circuit configuration used to form the voter selection/repair circuits shown in FIG. 9;

FIG. 11 is a timing diagram to illustrate operation of the voter selection/repair circuit of FIG. 10;

FIG. 12 is a logic diagram of the voter circuit used to implement the embodiment of the invention shown in FIG. 9; and FIG. 13 illustrates redundant input and output terminals used to communicate electrical signals to and from the wafer carrying the circuit copies of FIG. 1.

DETAILED DESCRIPTION OF THE INVENTION

The present invention is direoted to achieving very large-scale integration, allowing an immensely complex circuit to be implemented in integrated circuit form. Referring to FIG. 1, three copies A, B and C of the circuit are conceptually illustrated as being formed on a semiconductor wafer 10. Each of the circuit copies A, B and C are functionally and electrically identical to each other; each are constructed to receive the same input signals (i.e., data, clocks, and the like) and to produce the same output signals as each of the other circuit copies. In short, the circuit copies A, B and C are identical to one another in all respects—except, perhaps, in the manner each is laid out on the wafer 10.

The circuit copies A, B and C include a very large number of individual circuit elements (not shown), capable of numbering upwards in the thousands. Each circuit element of the circuit copy A is conceptually assigned to one or more predetermined circuit element groups (not shown in FIG. 1). Each circuit element group may receive a number of input signals, but each is generally defined as having only one output. Similarly, each corresponding circuit element of circuit copies B and C is also a member of corresponding circuit element groups. It is at the output of each of the corresponding circuit element groups that an intercoupling between the circuit copies A, B and C occurs.

This is illustrated in FIG. 2, in which the three circuit copies A, B and C are illustrated as receiving input signals 12 to provide therefrom the output signals 13. Also shown in FIG. 2 are three representative circuit element groups 14a, 16a and 18a of the many that would make up the circuit copy A, and the circuit element groups 14b and 14c that would correspond to circuit element group 14a, respectively found in the circuit copies B and C. Not specifically shown, for reasons of clarity, are the circuit element groups carried by the copies B and C that correspond to the circuit element groups 16a and 18a.

As FIG. 2 illustrates, the circuit element groups 14a, 14b, and 14c each receive a number of signal lines 15a, 15b and 15c, respectively, and each is identified by an output line 20a, 20b and 20c and a voter circuit 22a, 22b and 22c. The voter circuits 22a, 22b and 22c are interconnected by a voting bus 26 to perform a voting operation, resulting in a voted output signal at each of the respective outputs 24a, 24b and 24c, which follows the majority (i.e., two out of three) of the signals applied. In Boolean algebra, the equation defining the output signal (F) that will appear at the voter output lines 24a, 24b and 24c of the respective voter circuits 22a, 22b and 22c is:

$$F = XY + YZ + XZ$$

where X, Y and Z are the signals received by the voter circuits 22a, 22b and 22c from the respective circuit element groups 14a, 14b and 14c.

The present invention is most advantageously practiced in developing a very large-scale integrated (VLSI) circuit using emitter-coupled logic (ECL) technology. With ECL circuitry, voting between corresponding circuit element groups of the circuit copies, A, B and C, is preferably implemented in one of two ways. In a first voting arrangement, the voting circuit configuration incorporates a multiplexer/latch combination that provides a diagnostic tool for identifying good and bad circuit element groups. This voting arrangement is discussed with reference to FIGS. 6–8, below. A second arrangement uses only that circuitry necessary to implement the voting function, and one form of this arrangement is illustrated in FIG. 3. This second arrangement does not include provision for diagnostic testing, and for this reason is less preferred. It is used when inclusion of the additional multiplexer/latch circuitry would be unacceptable at the point in question. Thus, the voter circuits 22a, 22b, and 22c (FIG. 2) preferably take one of these two arrangements.

A simplified form of the second voting arrangement, which the voting circuits 22a, 22b, and 22c (FIG. 2) can take, is illustrated in FIG. 3. The voting circuits 22a, 22b and 22c are identically constructed. Accordingly, only the circuitry of the voting circuit 22a is detailed and discussed, it being understood, however, that the following discussion applies equally to voting circuits 22b and 22c.

As illustrated in FIG. 3, the voting circuit 22a includes an input section 40a and an output amplifier 42a. Signal lines 43a and 44a interconnect the input and output sections 40a and 42a, and also form the nodes that are interconnected with the corresponding voting nodes of the voter circuits 22b and 22c by the voting bus 26.

The input section 40a comprises a pair of emitter-coupled transistors Q1, Q2, the emitter leads of which are coupled to a current sink formed by a series combination of transistor Q3 and resistor R3. Transistor Q3 receives a reference voltage $V_{cs}$ that sets, with resistor R3, the current flow therethrough.

The respective collector leads of the transistors Q1 and Q2 are connected to the two-wire voting bus 26 by the signal lines 43a and 44a, which in turn is connected to corresponding transistor collector leads (not shown) of the input sections of voter circuits 22b and 22c. The collector leads of the transistors Q1 and Q2 are also coupled to the output amplifier 42a, which comprises a pair of emitter-coupled transistors Q4, Q5, a current sink formed by resistor R6 and transistor Q6. The output amplifier 42a also includes, as an input section thereto, transistors Q6 and Q7 (and associated emitter resistors) which function as emitter-follower drivers to perform voltage-level translation and to improve noise immunity. The base lead of transistor Q6 also receives the reference voltage $V_{cs}$ to set the current conducted by the current sink.

It will be noted by those skilled in this art that the circuit structure of the input stage 40a, together with the transistors Q6 and Q7 (shown here as a part of the output section 42a for reasons of ease of explanation), form the output configuration of many ECL gates capable of providing complementary outputs. In addition, many input configurations of ECL gate structures include an emitter-coupled pair and current sink. Thus, when the voter circuit 22a configuration is used, the input and stages 40a and 42a will, in many cases, actually be a part of the available circuit elements involved in the voting process. In this instance, only the voter bus 26 need be added to implement voting.

In operation, each of the circuit element groups 14a, 14b and 14c (FIG. 2) respectively forming a part of the circuit copies A, B and C receive substantially identical signals at inputs 15a, 15b and 15c. If all three circuit element groups 14a, 14b and 14c are functioning properly, the output signals appearing on signal lines 20a, 20b and 20c will be substantially identical. Accordingly, one of the bus lines of voting bus 26 will tend to follow the input signals, while other bus lines will follow the complement of the input signals. For example, assume that circuit element group 14a is faulty so that the signal conducted on signal line 20a does not match those conducted on signal lines 20b and 20c. The interconnections, by the voting bus 26, of the collector leads of transistors Q1 and Q2 (FIG. 3) and their corresponding duplicates in voter circuits 22b and 22c, perform a current summing operation. The result is that the signals on the voting bus 26 will tend to follow the majority, i.e., the signals on signal lines 20b and 20c. The "vote" is made by a summing of currents that take place in the resistors R1 and R2 (and their corresponding counterparts found in the voting circuits 22b and 22c). The majority function is indicated by a difference voltage established, by this summing, between the bus lines 26' and 26". The transistor pair Q4 and Q5 of the output section 42a (as well as those corresponding transistors that would be found in voter circuits 22b and 22c) amplify this difference to produce the voted output voltages VOa and $\overline{VOa}$. These voted signals are then distributed within the respective circuit copy A per the circuit design. In similar fashion voted signals (identical to VOa and $\overline{VOa}$) are produced by the voting circuits corresponding to the voting circuit 22a, i.e., voting circuits 22b and 22c.

Signal lines 24a conduct the voted output to the inputs of other circuit element groups formed of circuit copy A (as do signal lines 24b and 24c of copies B and C). Thus, if, for example, the circuit element group 14a is in some way defective so that an incorrect signal is produced therefrom, the copies corresponding to that circuit element group will operate to "out-vote" the incorrect signal to produce a voted output signal from all three voting circuits 22a, 22b and 22c.

Although the particular voting configuration described above is preferred because of its particular adaptability to ECL circuits, other alternatives of voting circuit configuration are available. For example, an alternative to the current summing technique is a voltage summing technique, illustrated in FIG. 4. As shown, a differential amplifier 46a receives at its non-inverting (+) input a single-wire voting bus 47. The inverting input (−) of the amplifier 46a is connected to a reference voltage $V_{REF}$.

Resistors R7a, R7b and R7c each respectively couple to the voting bus 47 a corresponding circuit element group (not shown) of the circuit copies A, B and C, conducting data signals Da, Db and Dc to the amplifier 46a. In the same manner that signal line 48a connects the voting bus 48 to the amplifier 46a, signal leads 48b and 48c connect the voting bus 48 to the noninverting inputs (+) of differential amplifiers (not shown) corresponding to amplifier 46a. Constructed as shown in FIG. 4, each voter circuit will produce a voted output signal that follows a majority determined by summing the voltage level applied to the non-inverting (+) inputs of amplifier 46a and its corresponding counterparts (not shown) on circuit copies B and C.

Yet another configuration for interconnecting circuit element groups in a voting arrangement is illustrated in FIG. 5. Here, a voting circuit, designated with the reference numeral 50 includes three intercoupled transistor pairs Q9/Q10, Q11/Q12, and Q13/Q14, the emitter leads of each pair being coupled to ground by resistors R8, R9 and R10, respectively, and to a corresponding one of the emitter leads of a multiple emitter lead transistor Q15. The collector leads of the transistors Q9–Q14 are coupled to a supply voltage, $V_{cc}$, while the collector lead of the multiple emitter Q13 is coupled to $V_{cc}$ by a resistor R11. The collector and base leads of the multiple emitter transistor Q13 are interconnected, forming the output of the voting circuit 50, at which appears the output voltage Fa.

The base lead of each of the transistors Q9, Q10, Q11, Q12, Q13 and Q14 receive the data signals Da. Db and Dc that would be provided by corresponding circuit element groups. Each of the transistor pairs Q9/Q10, Q11/Q12 and Q13/Q14 form a non-threshold OR gate, while the multiple emitter transistor Q15 forms a non-threshold AND gate. So structured, the voter circuit 50 implements the logic function $$Fa = Da\ Db + Db\ Dc + Dc\ Da,$$

thereby obtaining a majority vote, but in a slightly different manner than that shown in FIG. 3. The output voltage Fa will approximately follow the input that is at the middle potential, thereby functioning as a median follower. For this reason, it is believed that the voter circuit 50 is better suited for linear application of the present invention.

The voting circuits discussed to this point effectively reduce the amount of circuitry subject to being affected by disabling defects to any two of the three corresponding circuit element group replications; that is, two circuit groups of any corresponding set must be rendered inoperative by, for example, fabrication defects before the entire die is affected. If only one of the corresponding three circuit element groups is defective, the voting operation ensures that the overall system is not affected.

Certainly, it would be desirable to "repair" the situation of two defective or questionable circuit element groups and one operative one. This could be, and as will be seen is, accomplished by (1) determining which are the inoperable circuit element groups and (2) deleting the questionable circuit element groups from participation in the voting operation. Thereby, an otherwise inoperative chip is rendered useful.

Illustrated in FIG. 6 is an alternate but preferred embodiment of the present invention, incorporating the repairability concept and providing a diagnostic test capability. Shown in block diagram form, and designated with the reference numerals 60a, 60b and 60c, are three representative voter circuits, each forming a part of circuit copies A, B and C. The voter circuits 60a, 60b and 60c are identically configured. Accordingly, only the voter circuit 60a will be discussed, it being understood that the discussion applies equally to voter circuits 60b and 60c.

As shown in FIG. 6, the voter circuit 60a includes a two-input multiplexer 62a and a latch 64a. Data lines 70a and 72a couple the data outputs D and $\overline{D}$ (true and complement, respectively) of the multiplexer 62a to corresponding inputs of the latch 64a. A data input (1) of the multiplexer 62a receives a signal line 66a that conducts an output signal Da produced by an associated circuit element group (not shown) of the circuit copy A. Received at the data input (2) of the multiplexer 66a is a signal line 68a which communicates a Scan Path (SPa) signal used for diagnostic purposes. Multiplexer 62a includes a fused connection Fa which, when interrupted, disables the multiplexer 62a, removing it from the voting process and leaving the corresponding voter circuit copies 60b and 60c unaffected.

The multiplexer 62a also receives, via signal line 74a, a Scan Select (SSa) signal, responding thereto, depending upon the state of the SSa signal, to select one of the multiplexer inputs 1 and 2, for communication to the multiplexer outputs D and $\overline{D}$. During normal operation, the state of the SSa signal is such that the multiplexer input 1 is selected; multiplexer input 2 is selected only during diagnostic operation.

In similar fashion, the voter circuits 60b and 60c receive Scan Select and Scan Path signals SSb, SSc, SPb and SPc, respectively, which are indigenous to the circuit copies B and C. Their function and operation are the same as those used in circuit copy A.

The multiplexer 62a also receives an inhibit (α) signal on signal line 76a. The α signal is applied to the multiplexers 62a of all voter circuits 60a formed as a part of circuit copy A. The same is true for the β and γ signals applied to the voter circuits 60b and 60c of circuit copies B and C, respectively. When a logic HIGH, the α signal functions to disable the voter circuit 60a, removing it from participation in the voting process in a manner that permits the corresponding voter circuit copies 60b and 60c of voter circuit 60a to continue to operate. More commonly, as will be seen, two inhibit signals (e.g., α and γ or β and γ, etc.) will be used to disable entire circuit copies, leaving one operable. This provides a technique, which will be discussed further below, to determine defective or inoperative circuit element groups.

The signals selected by the multiplexer 62a are stored by the latch 64a in response to clock signals CKa and $\overline{CKa}$ ($\overline{CKa}$ being the complement of CKa), appearing at the Q (and its complement $\overline{Q}$) output of the latch 64a. The Q (and $\overline{Q}$) output of the latch is coupled by signal line 78a (and 80a) to the other circuit elements (not shown) that would normally receive the Da signal from the circuit element group (not shown) associated with the voter circuit 60a.

In operation, each voter circuit 60a, 60b and 60c receives the signal provided by its associated circuit element group (not shown), i.e., the signals Da, Db and Dc, on the signal lines 66a, 66b and 66c. With the scan select signals SSa, SSb and SSc, in a LOW state, the input 1 of each multiplexer 62a, 62b and 62c will be selected. The signals are voted via the interconnection provided by the voting bus 126, in the same manner as described above (with respect to FIG. 3) and applied to the data inputs D and $\overline{D}$ of the latches 64a, 64b and 64c. The voted signals, after the occurrence of the clock signals, appear at the output signal lines 78a, 78b and 78c.

Assume, for the moment, that the circuit element group associated with the voter circuit 60b is defective so that an incorrect data signal Db is provided; that is, it is not in agreement with the data signals Da and Dc—as it should be. Assume further that the circuit element groups associated with the voter circuits 60a and 60b are operative and that the signals Da and Dc provided thereby are correct. The voting that takes place via the voting bus 126 will establish at each of the data inputs D and $\overline{D}$ of the corresponding latches 64a, 64b and 64c a voted data signal that follows the data signals Da and Dc. The voted signal appears at the Q output of the latch 64b when the clock signals CKb and $\overline{CKb}$ occur. Thus, even though the circuit element that generated the data signal Db may be defective, a proper and correct signal will be voted and caused to appear at the output of the voter 60b for communication to the remainder of the circuit elements of circuit copy B.

The circuit configuration of multiplexer 62a and latch 64a is illustrated in FIG. 7. Again, as noted above, the multiplexer/latch combinations 62b/64b and 62c/64c are identical in construction to that of multiplexer/latch 62a/64a. The following discussion of multiplexer/latch combination 62a/64a will apply equally to the multiplexer/latch combinations 62b/64b and 62c/64c, unless noted otherwise.

As shown in FIG. 7, the multiplexer 62a is constructed using ECL structure, and includes two pair of emitter-coupled transistors Q16, Q17 and Q18, Q19 to form input stages for receiving the data signal Da and the scan signal SPa, respectively. The connected emitter leads of the transistor pair Q16, Q17 are coupled, by a pass transistor Q21, to a current sink consisting of transistor Q23, resistor R12, and a fused link Fa, all in series circuit configuration. In similar fashion, the connected emitter leads of the transistor pair Q17, Q19 are coupled to the current sink by a pass transistor Q20. The pass transistors Q20 and Q21 form an emittercoupled pair that receive at their base leads the SSa signal and a reference voltage VB2. Depending upon the state (i.e., HIGH or LOW, relative to VB2) of the SSa signal, one of the pass transistors Q20, Q21 will be placed in a conducting state, the other in a non-conducting state. The pass transistor so placed in conduction thereby functions to select one of the signals Da and SPa for communication to the latch 64a signal lines 70a and 72a. The respective collector leads of the transistors Q16 and Q18, and transistors Q17 and Q19, are connected together and to a corresponding one wire of the two wires forming the voting bus 126; and, by the voting bus 126, the collectors are coupled to corresponding transistor collect leads (not shown) of multiplexers 62b and 62c (FIG. 6)—found in circuit copies B and C, respectively.

Still referring to the construction of the multiplexer 62a of FIG. 7, connected to the collector lead of the transistor Q23 is the emitter lead of a switch transistor Q22, whose collector, in turn, is connected to the supply voltage voltage $V_{cc}$. The base lead of the transistor Q22 receives α signal. When the α signal is a logic HIGH the entire multiplexer stage is disabled because the current required by the current sink 74 is produced substantially by the switch transistor Q22. Both transistor pairs Q16, Q17 and Q18, Q19 are disabled and unable to conduct current. In this circumstance, the output signals D and $\overline{D}$ of the multiplexer 62a both go HIGH and, in this manner, are removed from participation in the voting with the corresponding replices of the multiplexer 62a, i.e., multiplexers 62b and 62c (FIG. 6).

The emitter-coupled transistor pairs Q16, Q17 and Q18, Q19 can also be disabled and thereby removed from the voting procedure by interruption of the fused link $F_a$. This, of course, is more permanent. As will be seen, the α signal is applied to all multiplexer circuits of circuit copy A to temporarily disable the entire copy for diagnostic testing. Similar signals, β and γ, temporarily disable circuit copies B and C. When diagnostic testing discovers an inoperative or malfunctioning circuit element group, the more permanent disablement of the associated multiplexer is effected by interruption of the fused link of that multiplexer.

FIG. 7 also illustrates the circuit configuration of the latch 64a. As will be seen, the latch 64a is of standard ECL construction, and includes input transistors Q24 and Q25 to receive the result of the vote performed between the interconnection of the multiplexers 62a, 62b and 62c by voting bus 126. Input transistors Q24 and Q25 translate the received voting voltage levels to ones compatible with ECL voltages of the latch.

The actual circuit implementation of the latching portion of the latch 64a is of a design known in the art, shown here for completeness of disclosure. Latching the applied data is accomplished by the emitter-coupled transistor pairs Q26, Q27 and Q28, Q29 which are, in turn, controlled by the clock signal CK and its complement $\overline{CK}$. Data is accepted when CK is HIGH, causing Q30 to establish a current pair for the transistor pair Q26, Q27 to the current sink formed by the transistor Q32, resistor R14, and the bias and supply voltages $V_{CS}$ and $V_{EE}$, respectively. Data is transferred to and held by the transistor pair Q28, Q29 when the clock signal CK changes state, switching the current path from transistor pair Q26, Q27 to transistor pair Q28, Q29.

In order to perform diagnostic testing and determine which, if any, of the circuit element groups are defective or provide incorrect data signals, "scan paths," as hereinabove indicated, are formed by interconnecting multiplexer/latch voter circuits of each circuit copy A, B and C, forming several strings of interconnected voter circuits. Known data can be shifted in, the system placed in a normal, operating mode and clocked one or more times to let the scanned-in-data be passed through by the circuit element groups. The system is returned to a diagnostic mode and the result shifted out. Computer analysis can then be performed on the data shifted in and the data shifted out to determine if any circuit element groups (through which data passed) are malfunctioning.

This voter circuit interconnection for diagnostic testing is illustrated in FIG. 8, where there is shown three representative voter circuits 90a, 92a and 94a as would be found on, for example, circuit copy A (FIG. 2). Each voter circuit 90a, 92a and 94a is identical in construction and function to that discussed with respect to FIGS. 6 and 7, in that each includes a multiplexer 62a and a latch 64a. Each respective multiplexer 64a receives at one data input (1) the signal produced by a corresponding one of the circuit element groups 96a, 98a and 100a. The other data input receives what has been previously referred to as a scan path (SP) signal (see FIGS. 6 and 7), which can now be seen in FIG. 8 as being the output of another voter circuit of circuit copy A. Thus, for example, as FIG. 8 illustrates, the second data input (2) of multiplexer 62a of the voter circuit 90a receives the Q output from the latch 64a of the voter circuit 92a. Similarly, the multiplexer 62a of the voter circuit 92a receives the output of the voter circuit 94a; and the second data input (2) of the multiplexer 62a of the voter circuit 94a receives the output of yet another voter circuit (not shown) of the circuit copy A, and so on. These voter circuit interconnections are copied exactly in circuit copies B and C. The two signal lines that intercouple the multiplexer 62a and the latch 64a of each voter circuit 90a, 92a and 94a are also respectively coupled by the voting buses 136, 146 and 156 to the corresponding multiplexer/latch interconnections on circuit copies B and C.

Each multiplexer 62a of the voter circuits 90a, 92a and 94a receives the San Select signal SSa via the signal line 74a (which is connected to all the multiplexers 62a of circuit copy A; the voter circuits of circuit copies B and C respectively receive the SSb and SSc signals in similar fashion). When the SSa signal is HIGH the second data inputs of all multiplexers 62a of circuit copy A are selected to interconnect the voter circuits and thereby form one or more shift registers, a portion of which is shown in FIG. 8. Known data words can then be shifted into these shift registers for diagnostic purposes. In practice, the die 10 (FIG. 1) is arbitrarily divided into four conceptual quadrants, and the voter circuits of each quadrant connected as described above, thereby forming four long shift registers (i.e., four scan paths). Each scan path so formed has a single input (not shown) and a single output (not shown).

Diagnostic testing is accomplished by bringing the scan select signals SSa, SSb and SSc HIGH to select each second data input (2) of each multiplexer 62a, 62b and 62c of circuit copies A, B and C, and forming the four diagnostic scan paths discussed above. A predetermined bit pattern is then clocked into each of the four scan paths so formed and the SSa, SSb and SSc signals brought LOW (thereby selecting the first data input (1) of each multiplexer 62a, 62b and 62c). Two of the three disabling signals ($\alpha$), ($\beta$), and ($\gamma$) are brought HIGH, at the same time keeping the remaining disabling signal LOW. Thereby, two of the three circuit copies A, B, C are completely disabled in the manner described above, leaving operative one of the three circuit copies. For example, assume that $\alpha$ and $\beta$ are HIGH and $\gamma$ is LOW. Circuit copies A and B will thereby be disabled, leaving only circuit copy C enabled. The enabled one of the three circuit copies A, B and C, i.e., circuit copy C, is clocked one or more times in its normal operating mode. The SSa, SSb and SSc signals are again brought HIGH, switching from normal mode operation to diagnostic mode operation, and again setting up the scan paths. All circuit copies A, B and C are enabled and the latches 64a, 64b and 64c of the enabled circuit are clocked to shift out the stored data states which are then used to determine the condition of the circuit element groups and associated voter circuits.

This diagnostic procedure is repeated with each of the circuit copies A and B left in an operative condition (i.e., by bringing the corresponding inhibit signal $\alpha$, $\beta$, $\alpha$ to a LOW) and the other two circuit copies disabled (i.e., bringing the corresponding inhibit signal $\alpha$, $\beta$, $\gamma$ to a logic HIGH).

In the event that a pair of a corresponding three of circuit element groups are found to be defective, they are disabled by interrupting the fused link $F_i$ (i=a, b or c—see FIGS. 6 and 7). For example, referring to FIG. 6, assume that of the three corresponding voter circuits 60a, 60b and 66c diagnostic testing revealed that the circuit element groups (not shown) associated with voter circuits 60a and 60b (and produce data signals Da and Db) are found to be defective, and that the circuit element group (not shown) associated with the voter circuit 60c is operative. In such a case, the respective fused links $F_a$ and $F_b$ of multiplexers 62a and 62b would be interrupted, thereby disabling the multiplexers 62a and 62b from participation in the voting that takes place at the output of each respective multiplexer. The signal Dc that is applied to the voter circuit 60c would control the voting process; thus, the output of the voter circuits 60a, 60b and 60c would follow the signal Dc applied to the voter circuit 60c.

Preferably, in order to keep the component count within each circuit element group small, the depth of each circuit element group (i.e., the number of individual circuit elements encountered from any input of the group to the single output) is limited to a specific number—on the order of 7-10. As indicated above, the preferred practice of the invention would utilize, for each circuit element group, a voter circuit configured as shown in FIGS. 6 and 7, i.e., each would preferably include a multiplexer and a latch to provide diagnostic testing and repair capability. However, operating conditions can work to prohibit this preferred implementation of the invention. Placing an additional multiplexer and latch in a signal path can introduce unacceptable delay. In such instances, the voter circuit of the type illustrated in FIG. 3 (i.e., the voter circuit 22) is used.

There may also arise situations in which voting can be accomplished with a multiplexer/latch arrangement at a point where no latch is needed during normal operation. In this situation, the latch in question will receive a special clock signal for commanding latching operation of input data, one that will hold the latch in a state transparent to the data during the system's normal operating mode, yet clocks the latch in synchronism with other latches during diagnostic modes.

This is illustrated in FIG. 8, in which the latch 64a of the voter circuit 94a is shown as receiving (true and complement) clock signals CK1a and $\overline{CK1a}$ on the clock bus 112a. The latches 64a of the voter circuits 90a and 92a receive (true and complement) signals CKa and $\overline{CKa}$ on clock bus 110a. During normal operating mode, the CKa and $\overline{CKa}$ signals will be active, changing state as necessary to effect clocking of the corresponding latches that receive these signals. The CK1a and $\overline{CK1a}$ clock signals, on the other hand, are held in a steady-state condition with CK1a HIGH and $\overline{CK1a}$ LOW during normal operating mode. This permits the latch 64a of the voter circuit 94a to act as a conduit, transferring data from the input to the output with no latching operation. Voting is unaffected since the pass transistor Q30 (FIG. 7) is in a conducting state, placing the transistor pair Q26, Q27 in an operative condition. When the system is run in a diagnostic mode, however, the CK1a and $\overline{CK1a}$ clocks are made identical to their respective counterparts—clock signals CKa and $\overline{CKa}$.

As has been noted, the present invention is most easily implemented in ECL circuit configuration. It will be recognized, however, to those skilled in this art that large systems may also be implemented in MOS or CMOS circuitry to achieve the low power consumption and other advantages provided thereby. Accordingly, referring to FIG. 9, there is illustrated an alternative embodiment of the present invention capable of implementation in CMOS transistor circuitry.

Shown in block diagram form in FIG. 9 is a CMOS implementation of the present invention. As described above, three circuit copies A, B, and C would each include a plurality of interconnected voter circuits. Thus, each circuit element group designated in each circuit copy A, B and C, would include voter circuits 118a, 118b and 118c, respectively. For the most part, the voter circuits on the copy A, e.g., voter circuit 118a, are identical to those found on copies B and C (e.g., voter circuits 118b and 118c). Accordingly, only the voter circuit 118a will be discussed, it being understood that the discussion can be applied equally to the voter circuits 118b and 118c.

As FIG. 9 shows, the voter circuit 118a includes a two-input multiplexer 120a that receives at its two data inputs the data from its corresponding circuit element group (not shown) $D_A$ and the scan signal $SCAN_A$. Selection between these two signals is effected in the same manner as described above, and the selection signals are not shown. The multiplexed signal from multiplexer 120a, together with those multiplexers 120b and 120c from copies B and C, form a bus 124 which is applied to the voter 122a.

The voter 122a performs the majority voting operation, and, as will be seen below, is structured to implement the repair/disablement used to remove two of the three circuit element groups from operation when one (or two) is found to be defective. For this latter function, the voter 122a receives six signals, two each from the voter repair/selection circuits 126a (on circuit copy A), 126b (on circuit copy B), and 126c (on circuit copy C). The voted output produced by the voter 122a is coupled, via signal line 130a, to a latch 132a.

The multiplexers 120a, 120b and 120c and latches 132a, 132b, and 132c are identical in function to the multiplexers and latches described with respect to FIG. 3, and can be implemented in either MOS or CMOS circuit configuration in a number of known techniques. The voter 122a and voter repair/selection circuits 126a require special consideration to implement the present invention, and accordingly the remaining discussion will focus on those circuits.

Referring now to FIG. 10, the voter selection/repair circuit 126a is shown in greater detail as including a pair of two-input NAND gates 140, 142, an inverter 144, and a fused link F1. Each of the voter circuits 118a (FIG. 9) will have associated therewith a voter selection/repair circuit 126a; that is, the signal α that functions to select or de-select circuit element groups for diagnostic and/or repair operation are locally generated. The voter selection/repair circuit 126a receives control signals $T_{A1}$ and $T_{A2}$, that are respectively applied to an input of each of the NAND gates 140 and 142. The output of the voter selection/repair circuit 126a, the signal α (and its complement $\overline{\alpha}$, via the inverter 144) is provided by NAND gate 142. The output of the NAND gate 142 is also coupled back and applied to an input of the NAND gate 140 to form a latch configuration. The output of the NAND gate 140 is applied to an input of the NAND gate 142, and is also shorted to the supply voltage $V_{CC}$ by the fused link F1.

Referring to FIGS. 10 and 11, the latter figure being a timing diagram of the voter selection/repair circuit 126a, operation of that circuit will now be described: When the fused link F1 is intact, the node X, which is the output of the NAND gate 140, is held at substantially the supply voltage, $V_{CC}$. Thus, the NAND gate 140 has no effect on the state of the output signal α. Rather, the output signal α will follow the complement of $T_{A2}$ that is applied to the NAND gate 142. The input signals $T_{A1}$ and $T_{A2}$ are normally HIGH, active LOW signals. Thus, when the fused link F1 is intact, the output signal α is impervious to the input signal $T_{A1}$ (such as, for example, at time $T_1$ FIG. 11). However, if the input signal $T_{A2}$ undergoes a negative excursion, such as as time $T_2$ (FIG. 11), the output signal α responds accordingly.

Assume now, that at the time indicated as $T_3$ in FIG. 11, the fused link F1 is interrupted. When the input signal $T_{A2}$ to the voter selection/repair circuit 126 is pulsed (active LOW), at time $T_4$, the output signal α responds by going to a HIGH state, and remains HIGH even when the input signal $T_{A2}$ returns to its inactive, HIGH state. The latch formed from the NAND gates 140, 142 has now been set. The $T_{A1}$ input signal functions to reset the latch. Thus, at the time designated $T_5$, when the input signal $T_{A1}$ assumes an active LOW, the output signal α goes LOW and must await an active LOW from the signal $T_{A2}$ before being set once again.

The output signal α, $\overline{\alpha}$, produced by the voter selection/repair circuit 126a combine with corresponding output signals (β, $\overline{\beta}$, γ, $\overline{\gamma}$) from the voter repair/selection circuits 126b and 126c (FIG. 9) to form the bus 128. These signals are used to selectively disable corresponding ones of the voter circuits 118a, 118b, and 118c during diagnostic procedures or, when the fused link F1 (FIG. 10) is opened to disable two of the voter circuits, leaves an operable voter circuit (as determined by diagnostic procedures) in operation.

The actual disabling/enabling of the voting function is performed within the voter itself in response to the α signal from the associated voter repair/selection circuit. Illustrated in FIG. 12 is the circuit construction of the voter 122a, showing the voter 122a as comprising three two-input OR gates 150, 152 and 154, three three-input NAND gates 156, 158 and 160, and a three-input AND gate 162 intercoupled as shown. The voter 122a receives the output signals provided by the respective multiplexers 120a, 120b and 120c, i.e., signals A, B, and C. The selection bus 128 carries the signals produced by the respective voter repair/selection circuits 126a, 126b and 126c, i.e., signals $\alpha, \bar{\alpha}, \beta, \bar{\beta}, \gamma,$ and $\bar{\gamma}$, to the combinatorial logic (i.e., the OR and NAND gates 150, 152, 154 and 156, 158, 160) forming the voter 122a as well as identically constructed voters 122b and 122c.

Normally, the $\alpha$, $\beta$, and $\gamma$ signals are LOW (their complements HIGH) when no diagnostic select and/or repair is being effected. The voter 122a (as do voters 122b and 122c—FIG. 9) then operates to implement the equation:

$$F' = A\ B + A\ C + B\ C$$

which appears at the signal line 130a.

The voter 122a can be disabled, removing from operation its associated circuit element group (not shown) in the following manner: The associated voter repair/selection circuit 126a (FIGS. 9 and 10) is placed, by the input signal $T_{A2}$, in a state that forces the output signals $\alpha$ and $\bar{\alpha}$ HIGH and LOW, respectively; thus, $T_{A2}$ is made a LOW. At the same time, the corresponding input signals $T_{B2}$ and $T_{C2}$ (FIG. 9) are kept HIGH, forcing $\beta$ and $\gamma$ LOW ($\bar{\beta}$ and $\bar{\gamma}$ HIGH). Given these signal states, it can be seen that the NAND gate 158 is disabled; NAND gate 156 passes A; NAND gate 160 passes A+C; and AND gate 162 passes A·(A+C). The result: A is passed through the voter 122a.

As pointed out above in connection with discussion of the ECL-implemented embodiment of the invention, it is desirable to be able to determine which, if any, circuit element groups may be defective, and to remove those found defective from operation, leaving at least one operable copy of the circuit element groups. Thus, testing would be accomplished by removing from operation two circuit copies, leaving the third operable. This would be accomplished by setting the two of the signals $T_{A2}$, $T_{B2}$ and $T_{C2}$ LOW to inhibit the associated circuit element groups from being passed by the voters 122a, 122b and 122c. Only the one of the data signals $\bar{A}$, $\bar{B}$ and $\bar{C}$ (FIG. 12) associated with the one of the signals $T_{A2}$, $T_{B2}$ and $T_{C2}$ kept HIGH will be passed by the voters 122a, 122b and 122c.

The $T_{A2}$, $T_{B2}$ and $T_{C2}$ signals are coupled to all of the voter repair/selection circuits 126a, 126b, and 126c respectively forming the circuit copies A, B and C. Thus, forcing, for example, $T_{A2}$ and $T_{C2}$ LOW removes circuit copies A and C from operation in the manner described above. If $T_{B2}$ is kept HIGH, the circuit copy B is left in an operative state.

Repair is effected by interrupting the fused link F1 (FIG. 10) of the voter selection/repair circuit associated with the circuit element group desired to be disabled, and setting the latch of the voter selection/repair circuit (i.e., forcing the output of the NAND gate 142 HIGH). For example, assume that diagnostic testing has determined that the circuit element groups associated with the voters 122a and 122b (FIG. 9) to be inoperative, but that associated with voter 122c is determined to be good. Repair is effected by interrupting the fused link F1 (FIG. 10) contained in the voter repair/selection circuits 126a and 126b. This frees the output of the NAND gate 140, allowing it to respond to the inputs thereto. When all desired fused links F1 have been interrupted on all circuit copies, including those associated with voters 122a and 122b, the signals $T_{A2}$, $T_{B2}$, and $T_{C2}$ are brought LOW ($T_{A1}$, $T_{B1}$, and $T_{C1}$ remain HIGH). This causes the output signals $\alpha$, $\beta$, and $\gamma$ of those voter selection/repair circuits whose fused links were interrupted to be forced HIGH. The signals $T_{A1}$, $T_{B1}$ and $T_{C1}$ must be tied HIGH; as long as the signals $T_{A2}$, $T_{B2}$, and $T_{C2}$ are kept HIGH, only those voter selection/repair circuits with interrupted fused links will be "set" to provide HIGH output signals, in effecting disabling the circuit element groups associated therewith through the logic of the corresponding voters.

FIG. 13 demonstrates the manner in which signals are brought onto the die 10', and to the circuit copies A, B and C, as well as how signals are brought from the die 10'. As shown, each signal that is to be brought onto the die 10' is done so through a pair of input terminals 180. The input terminals 180 are joined on the die 10' at 182 and conducted therefrom by a signal line 184 to the respective inputs of representative circuit element groups 186a, 186b and 186c, each respectively located as part of the circuit copies A, B and C. In the event one circuit path connecting the input terminal pair 180 to point 182 fails (i.e., open circuit), a second is still available.

Still referring to FIG. 13, each signal to be brought from the die 10' is voted on each circuit copy A, B, and C by a voter circuit 192a, 192b, and 192c, respectively. Only the outputs of voters 192a and 192c are used. These outputs are respectively coupled by buffer amplifiers 194a, 194c and fuse connections F2a, F2c to output terminals 196. Normal use of the die 10' would have the output terminals 196 connected together. If one of the buffer amplifiers 194a, 194c is defective, the associated fuse F2a or F2c is opened, deleting the defective amplifier from effecting normal operation.

We claim:

1. A method of fabricating an electronic circuit in integrated circuit form on a single semiconductor chip, the electronic circuit including a plurality of interconnected circuit elements, the method comprising:
    forming at least three configurations of the electronic circuit on the chip;
    providing each configuration with a number of voting means for performing a voting operation to produce therefrom a voted output signal indicative of a majority of circuit element signals applied to the voting means, each voting means being operably coupled to the configurations to interconnect predetermined and corresponding ones of the circuit elements; and
    providing means for temporarily storing the voted output signal.

2. The method of claim 1, including the step of selectively intercoupling predetermined ones of the voting means to form at least one serial scan path having an input for receiving a diagnostic signal.

3. The method of claim 2, including the step of selectively removing said predetermined ones of the circuit elements from participation in the voting operation.

4. The method of claim 2, including the step of temporarily inhibiting all the circuit elements of at least one configuration from participation in the voting operation.

5. An electronic circuit forming a digital system constructed in integrated circuit form on a single semiconductor die, comprising:
   plural configurations of the electronic circuit formed on the die, each configuration including a multiplicity of interconnected circuit elements; and
   each configuration including a number of voter means intercoupling corresponding and predetermined first and second ones of the circuit elements, the voter means of each configuration being connected to receive output signals from the corresponding first ones of the circuit elements of the configurations to produce therefrom a voted output signal that is indicative of a majority of the received output signals, each of the voter means including latch means for temporarily holding the voted output signal.

6. The electronic circuit of claim 5, including means for selectively intercoupling predetermined ones of the voter means of each configuration to form at least one scan path that operably receives a diagnostic signal.

7. The electronic circuit of claim 6, each of the predetermined voter means including multiplexer means operable in a first state to receive and selectively communicate the corresponding output signal for voting and in a second state for interconnecting predetermined ones of the voting means of each configuration to form said scan path.

8. The electronic circuit of claim 5, including an odd number of the configurations formed on the chip.

9. The electronic circuit of claim 5, including means for temporarily inhibiting the first circuit elements of selected ones of the plural configurations from participation in the production of the voted output signal.

10. The electronic circuit of claim 9, and wherein predetermined ones of the voter means includes a multiplexer means operable in a first mode for receiving and communicating the output signal from a corresponding first circuit element for participation in production of the respective voted output signal and in a second mode that configures a predetermined number of the voter means as a scan path for serially receiving a diagnostic data word.

11. The electronic circuit of claim 10, wherein the electronic circuit configurations and the voter means are implemented in emitter-coupled logic, and each of the multiplexer means includes a transistor operable in response to receipt of a disable signal to place the multiplexer means in a disabled state to inhiibit the received output signal from participation in the production of the voted output signal.

12. The electronic circuit of claim 5, including means for selectively removing certain of the predetermined ones of the first circuit elements from participation in the production of the corresponding voted output signals.

13. The electronic circuit of claim 5, wherein predetermined ones of the voter means include disabling means for selectively removing designated ones of the first circuit elements from participation in the production of a voted output signal, the disabling means including a fused link operable when interrupted to effect said removal of the received output signal from the corresponding circuit elements from participation in the production of a voted output signal.

14. The electronic circuit of claim 13, and the disabling means including means operable in response to interruption of the fused link and to a reset signal to effect removal of said designated ones of of the first circuit elements from said participation.

15. The electronic circuit of claim 5, and wherein a number of said latch means are operable in a first mode for temporarily latching the voted output signal and a second mode in which said latching means is transparent to data therethrough.

16. An integrated circuit implementing an electronic system in the form of a signle semiconductor chip, the system including a multiplicity of interconnected circuit elements, the integrated circuit comprising:
   plural configurations of the electronic system formed on the chip, each configuration having the circuit elements associated therewith forming a plurality of circuit element groups, each circuit element group of each configuration having a corresponding, substantially identical, circuit element group in each of the other configurations, each circuit element group being defined by a group output for providing a group output signal thereat;
   voter means for each circuit element group, the voter means being coupled to receive the group output signals of the circuit element group and the corresponding circuit element groups to product therefrom a voted signal that is indicative of the majority of the received group output signals; and
   means for communicating the voted signal to predetermined other circuit element groups.

17. The integrated circuit of claim 18, wherein each circuit element of each configuration is a member of at least one of the circuit element groups of that configuration.

18. The integrated circuit of claim 16, and wherein predetermined ones of the voter means each include latch means for temporarily storing the voted signal.

19. The integrated circuit of claim 18, the predetermined ones of the voter means of each configuration further including multiplexer means for receiving the associated group output signal and a second voted signal produced by another of the predetermined ones of the voter means, the multiplexer means being operable to select the received group output signal or the second voted signal for participation in production of the voted output signal.

20. The integrated circuit of claim 19, the voter means including a voting bus intercoupling voting means coupled to corresponding ones of the circuit element groups, and wherein each of the multiplexer means is operable in a first mode to communicate the associated group output signal to the voting bus, and in a second mode for communicating the received second voted signal.

21. The integrated circuit of claim 19, wherein the voter means of each configuration are interconnected to form plural serial scan paths when said multiplexers are operated to select said second voted signal.

22. The integrated circuit of claim 16, and each voting means including a voting circuit comprising:
   a first emitter-coupled transistor pair coupled to receive the group output signal at a base electrode of a one of said first pair; and
   a voting bus intercoupling corresponding collector electrodes of the transistor pairs of corresponding ones of the voting circuits.

23. The integrated circuit of claim 22, and wherein each first transistor pair includes emitter circuit means coupled to the emitter electrodes of the first transistor pair for establishing a predetermined current therethrough.

24. The integrated circuit of claim 23, and wherein the emitter circuit means includes an interruptable link operably connected to terminate current flow through the first transistor pair when interrupted to disable the voter means for communicating the received group output signal for participation in the production of the voted signal.

25. A large-scale integration of an electronic circuit comprising:
  a substrate;
  a plurality of substantially identical replications of the electronic circuit formed on the substrate, each replication including a multiplicity of circuit element groups each comprising a number of circuit elements, each circuit element group having a corresponding circuit element group of substantially identical configuration forming a part of each of the other replications;
  voter means for each of the circuit element group of each replication for receiving output signals provided by the circuit element group and the corresponding ones of the circuit element group to produce therefrom a voted signal that is indicative of the majority of said received output signals.

26. The large-scale integration of claim 25, and wherein each voter means includes a first circuit means coupled to an output of each associated circuit element group for receiving the output signal therefrom and a voting bus operably intercoupling each of the first circuit means associated with corresponding ones of the circuit element groups for producing a difference voltage indicative of the voted signal.

27. The large-scale integration of claim 26, and wherein the voter means includes amplifier means coupled to the voting bus for producing the voted signal from the difference voltage.

28. The large-scale integration of claim 25, and wherein predetermined ones of the voter means each includes: multiplexer means coupled to the associated circuit element group for receiving the output signal therefrom; bus means operably intercoupling the multiplexer means that are coupled to corresponding ones of the circuit element groups for communicating a representation of the voted signal; and second circuit means for receiving the representation to produce therefrom the voted signal.

29. The large-scale integration of claim 28, and wherein the second circuit means includes latch means operable to receive and latch the voted signal.

30. The large-scale integration of claim 25, and wherein predetermined ones of the voter means each includes second circuit means operably coupled to respond to a diagnostic signal to cause said predetermined voter means to form a number of serial shift registers each having an input and an output for receiving a diagnostic data word.

31. The large-scale integration of claim 25, and wherein predetermined ones of the voter means each includes means operable in response to an inhibit signal to selectively inhibit the output signals associated with the circuit element groups of one or more of the replications from participation in production of the voted signal.

32. The large-scale integration of claim 25, and wherein predetermined the voter means each includes a fused link capable of being interrupted to cause the output signal from the associated circuit element group to be removed from participation in the production of the voted signal.

33. The large-scale integration of claim 25, including means coupling the voted signal to other of the circuit element groups of each configuration.

34. The large-scale integration of claim 25, including means coupling the voted signal to other of the circuit element groups of each configuration.

35. A method of fabricating an electronic circuit in integrated circuit form on a single semiconductor chip, the electronic circuit including a plurality of interconnected circuit elements, the method comprising the steps of:
  forming an odd number, greater than one, of configurations of the electronic circuit on the chip;
  defining predetermined circuit element groups from designated ones of the interconnected circuit elements, each circuit element group in each configuration having a corresponding, substantially identical circuit element group in each of the other configurations, each circuit element group being configured to produce a group output signal; and
  providing each circuit element group with a voting means coupled to receive the group output signals produced by the circuit element group and by the corresponding circuit element groups for performing a voting operation to produce therefrom a voted output signal indicative of a majority of the received group output signals, each voting means being operably coupled to interconnect predetermined ones of the circuit elemnet groups of the associated configuration.

36. The method of claim 35, including coupling predetermined ones of voting means to one another to form at least one scan path having an input for receiving a diagnostic signal.

37. The method of claim 36, including providing the diagnostic signal to interrogate and located faulty ones of the circuit element groups.

38. The method of claim 37, including eliminating located faulty ones of the circuit element groups from participation in the voting operation.

39. An electronic circuit constructed in integrated circuit form on a single semiconductor die, comprising:
  plural configurations of the electronic circuit formed on the die, each configuration including a multiplicity of interconnected circuit elements forming predetermined circuit element groups, each circuit element group being configured to produce a group output signal, each circuit element group of each configuration having a corresponding, substantially identically configured circuit element group in each of the other configurations; and
  each circuit element group including voter means connected to receive the group output signal produced by the circuit element group, and the group output signal produced by the corresponding circuit element groups, for producing a voted output signal that is indicative of a majority of the received group output signals.

40. The electronic circuit of claim 39, including means for receiving diagnostic signals operable to interrogate and locate faulty ones of the circuit element groups.

41. The electronic circuit of claim 40, including means of repairing located faulty ones of the circuit element groups by eliminating said located faulty ones of the circuit element groups from participation in the voter operation.

* * * * *